Oct. 9, 1951 H. C. GOODRICH, JR 2,570,938

VARIABLE REACTANCE TRANSISTOR CIRCUIT

Filed June 24, 1950

INVENTOR
HUNTER C. GOODRICH, JR.
BY H. O. Newton
ATTORNEY

Patented Oct. 9, 1951 2,570,938

UNITED STATES PATENT OFFICE 2,570,938

VARIABLE REACTANCE TRANSISTOR CIRCUIT

Hunter C. Goodrich, Jr., Collingswood, N. J., assignor to Radio Corporation of America, a corporation of Delaware Application June 24, 1950, Serial No. 170,088

13 Claims. (Cl. 332—29)

This invention relates generally to variable reactance electrical circuits, and has for its primary object to provide a semi-conductor circuit for varying or modulating the resonant frequency of a tuned circuit.

Semi-conductor devices of the type comprising a semi-conducting body and a base, an emitter and a collector in contact with the body are presently well known. These devices are usually called transistors. The semi-conducting body may, for example, consist of a crystal of germanium or silicon treated in a manner well known in the art. The base electrode is in low-resistance contact with the crystal and may be a large-area electrode. The emitter and collector electrodes are in rectifying contact with the crystal and may be point contacts or line contacts or they may even have a comparatively large contact area with the crystal. It is also known that such a semi-conductor device may be utilized in an amplifier or oscillator circuit.

In accordance with the present invention it has been found that a semi-conductor circuit may be arranged as a reactance circuit. Thus, a reactance appears between two of the electrodes of the transistor such as between the collector and base electrodes. The magnitude of the reactance may be adjusted or varied by a control voltage or signal. Such a variable reactance circuit may be utilized for many purposes such, for example, as for adjusting or varying the resonant frequency of a tuned circuit.

It is accordingly a further and important object of the present invention to provide a variable reactance circuit including a semi-conductor device.

Another object of the invention is to adjust or vary the width or the frequency of the pass band of a tuned amplifier with a variable semi-conductor reactance circuit.

A still further object of the invention is to adjust or modulate the frequency of a wave developed by an oscillator circuit by means of a semi-conductor device connected in a reactance circuit.

In accordance with the present invention it has been found that the collector current of a semi-conductor device of the type described may lag with respect to the emitter current. Such a lagging collector current represents a reactive impedance which appears looking into the collector and base electrodes. This reactive impedance may be adjusted or varied by adjusting or varying either the collector or the emitter bias voltage. Thus, a variable reactance circuit in accordance with the invention comprises a controlled circuit such as a resonant circuit which is coupled between the collector and base electrodes of a transistor. A path is provided between the emitter and base electrodes which presents a low impedance to currents at the frequency of the resonant circuit. By varying either the emitter or collector bias voltage the reactive impedance presented by the semi-conductor device is varied. Since this reactive impedance is coupled across the resonant circuit the frequency of the resonant circuit is also varied.

The resonant circuit may, for example, be the output circuit of an amplifier. In this case, the frequency of the pass band of the amplifier is varied. Alternatively, another tuned circuit may be coupled to the first resonant circuit and in that case the width of the pass band of the amplifier is varied. Finally, the resonant circuit may be the frequency determining circuit of an oscillator. In such a case, the frequency of the wave developed by the oscillator may be adjusted or modulated in accordance with the signal.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3:
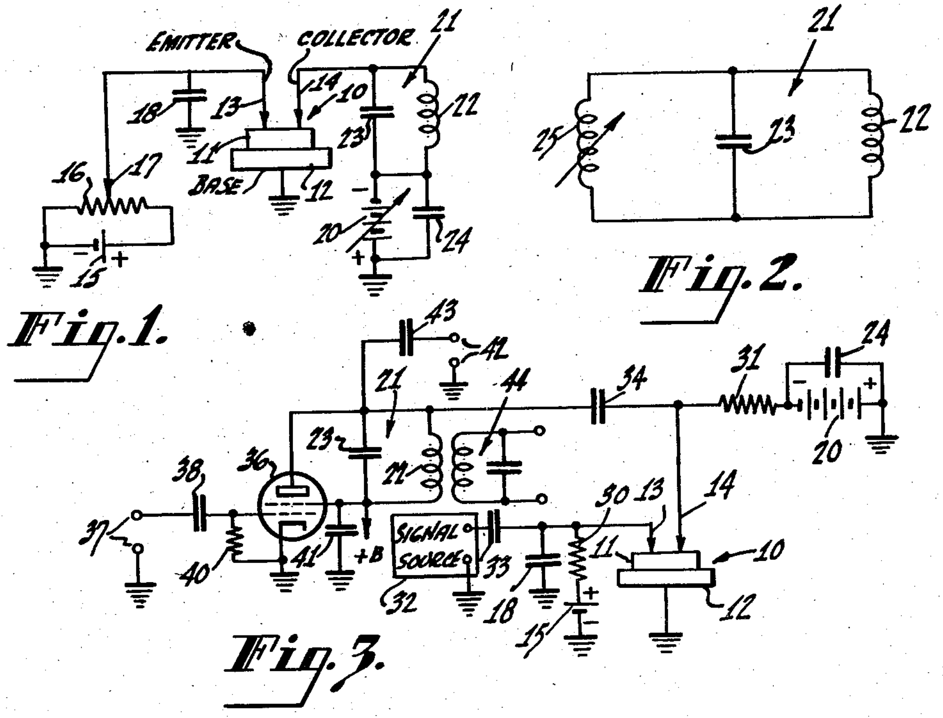
Figure 1 is a circuit diagram of a variable semi-conductor reactance circuit embodying the present invention.
Figure 2 is an equivalent circuit diagram of the reactance circuit of Figure 1.
Figure 4:
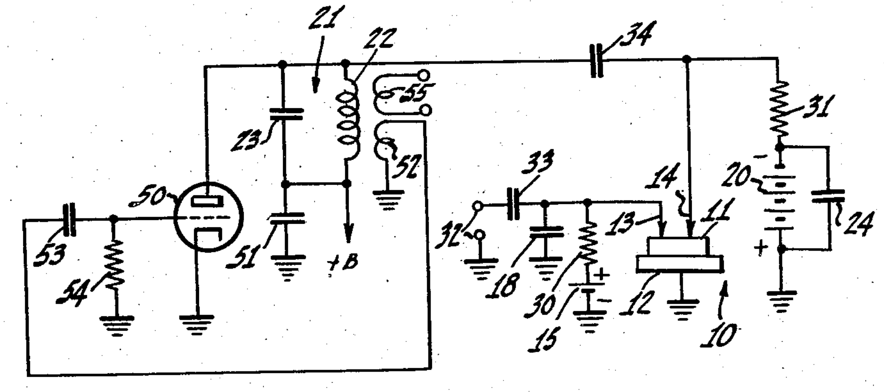

Figure 3 is a circuit diagram of a variable reactance circuit in accordance with the invention arranged for varying the width of the band pass of an amplifier or the frequency of its pass band; and Figure 4 is a circuit diagram of an oscillator circuit associated with a variable reactance circuit in accordance with the invention, for varying or modulating the frequency of the wave developed by the oscillator circuit.

Referring now to the drawing, in which like components have been designated by the same reference numerals throughout the figures, and particularly to Figure 1, there is illustrated a variable reactance circuit in accordance with the invention comprising a semi-conductor device generally indicated at 10. Semi-conductor device 10 includes body 11 of a semi-conducting material which may consist, for example, of silicon or germanium containing a small but sufficient number of atomic impurity centers or lattice imperfections as commonly employed for best results in crystal rectifiers or transistors. Body 11 may consist of germanium which may be prepared so as to be an N type semi-conductor as is well known. The surface of body 11 may be polished and etched in a conventional manner.

Base electrode 12, emitter electrode 13 and collector electrode 14 are in contact with body 10. As pointed out previously, base electrode 12 is in low-resistance contact with body 11 and may, for example, consist of a suitable piece of metal such as brass which is soldered to body 11. Emitter electrode 13 and collector electrode 14 are in rectifying contact with body 11 and may consist of point electrodes, they may be line contact electrodes or they may even be in large-area contact with the body 11. Electrodes 13 and 14 may consist of fine pointed wires of tungsten or phosphor bronze.

For operation as an amplifier a bias voltage in the forward direction must be applied between emitter 13 and base 12. Furthermore, a bias voltage in the reverse direction must be applied between collector 14 and base 12. Assuming that body 11 consists of an N type crystal emitter 13 should be positive with respect to base 12 while collector 14 should be negative with respect to the base. If the crystal is of the P type the potentials must be reversed. Thus, battery 15 may be provided to bias emitter 13 in the forward direction. To this end the negative terminal of battery 15 is grounded while a resistor 16 is connected across the battery. Variable tap 17 on resistor 16 is connected to emitter 13 to apply an adjustable positive voltage to the emitter. Base 12 is grounded as shown. Capacitor 18 is connected between emitter 13 and ground, that is, between emitter 13 and base 12. The purpose of capacitor 18 will be described hereinafter.

Battery 20 which may be adjustable as shown, is provided for the purpose of applying a voltage in the reverse direction to collector 14. To this end the positive terminal of battery 20 is grounded while its negative terminal is connected to collector 14 through a controlled circuit 21 which may be a tuned circuit. Tuned circuit 21 includes inductor 22 and capacitor 23 connected in parallel. Bypass capacitor 24 may be connected across battery 20.

Capacitor 18 connected between emitter 13 and base 12 presents a low impedance to currents at the frequency of resonant circuit 21. More specifically, the reactive impedance of capacitor 18 at the frequency of resonant circuit 21 should be low compared to the equivalent emitter resistance, that is, the resistance which appears looking into emitter electrode 13. The equivalent emitter resistance of device 10 is of the order of a few hundred ohms and usually less than 500 ohms.

It has been found that the circuit of Figure 1 when operated as shown with a low impedance path between emitter 13 and base 12 for currents at the frequency of resonant circuit 21 produces a lagging reactive collector current, that is, the collector current lags with respect to the emitter current. This lagging collector current raises the apparent resonant frequency of tuned circuit 21. It has also been found that the magnitude of this reactive effect is a function of either the emitter or the collector bias voltages. Thus, by varying tap 17 on resistor 16 or by adjusting battery 20 the effective resonant frequency of circuit 21 may be adjusted or varied.

An equivalent circuit diagram of the reactive circuit of Figure 1 has been illustrated in Figure 2. It will be seen that resonant circuit 21 consisting of inductor 22 and capacitor 23 is shunted by variable inductor 25. Inductor 25 indicates the variable inductive effect which appears between collector electrode 14 and base electrode 12. Let is be assumed that the resonant frequency of circuit 21 is 623 kc. (kilocycles). If the emitter current amounts to .1 ma. (milliamperes) the resonant frequency of circuit 21 remains unchanged. However, when tap 17 is adjusted to produce an emitter current of .75 ma., the apparent resonant frequency of turned circuit 21 is now raised to 645 kc. Thus, an increase of the emitter current causes an increase of the apparent resonant frequency of tuned circuit 21 caused by a decrease of the inductance of inductor 25.

Figure 3 to which reference is now made, shows an amplifier having a pass band of adjustable frequency or of adjustable width by means of the variable rectance circuit of the invention. The variable reactance circuit includes semi-conductor device 10. Emitter electrode 13 is connected to battery 15 through resistor 30. Collector electrode 14 is connected to battery 20 through collector resistor 31. Base electrode 12 is again grounded and capacitor 18 connects emitter electrode 13 to base electrode 12. A control signal source indicated at 32 has one terminal grounded while its other terminal is coupled to emitter 13 through coupling capacitor 33. Capacitor 33 is optional and may be omitted if the signal developed by source 32 is a direct current voltage.

The circuit described herein operates in substantially the same manner as the circuit of Figure 1. Capacitor 18 should again provide a low impedance path for currents at the frequency of resonant circuit 21 which is coupled to collector electrode 14 through coupling capacitor 34. However, capacitor 18 should have an appreciable impedance for signal currents developed by source 32. The resistance of resistor 31 should be large compared to the equivalent collector resistance which is the resistance looking into collector electrode 14. Furthermore, coupling capacitor 34 should have a capacitance which is large compared to the capacitance of capacitor 23 of resonant circuit 21.

Resonant circuit 21 may, for example, form the output load of an amplifier circuit including vacuum tube tetrode 36. The cathode of amplifier tube 36 may be grounded and the signal to be amplified may be impressed by input terminals 37 and coupling capacitor 38 between the control grid and cathode of amplifier tube 36. The control grid may be grounded by grid leak resistor 40. A suitable source of anode voltage supply indicated at +B is connected to one terminal of resonant circuit 21. Its other terminal is connected to the anode of amplifier tube 36. The screen grid of the amplifier tube 36 may be connected directly to +B which may be bypassed to ground by capacitor 41. The output signal may be derived from output terminals 42, one of which is grounded while the other one is coupled to the plate of amplifier tube 36 through coupling capacitor 43.

In accordance with the control signal developed by source 32 the resonant frequency of tuned circuit 21 is varied or modulated thereby to vary the frequency of the pass band. Alternatively, the output signal may be derived from tuned output circuit 44 which has a fixed frequency equal to the normal frequency of tuned circuit 21 and which may be inductively coupled to tuned circuit 21. In that case, the width of the pass band of amplifier tube 36 may be adjusted or varied by the control signal developed by source 32. It will be obvious that the width of the amplifier pass band depends on the difference between the apparent resonant frequencies of tuned circuits 21 and 44.

It is also feasible to adjust or modulate the frequency of the wave developed by an oscillator circuit. Such a circuit has been illustrated in Figure 4. The variable reactance circuit of Figure 4 is identical to that of Figure 3 and therefore a further description is not necessary here. Resonant circuit 21 which is coupled by coupling capacitor 31 to collector electrode 14 is now the frequency-determining circuit or the tank circuit of the oscillator. The oscillator includes vacuum tube triode 50 having its cathode grounded. Resonant circuit 21 is connected to the anode of tube 50. The other terminal of resonant circuit 21 is connected to a suitable anode voltage supply indicated at +B which may be bypassed to ground by capacitor 51. Inductor 52 is inductively coupled to inductor 22 of resonant circuit 21. One terminal of inductor 52 is grounded while its other terminal is coupled to the control grid of oscillator tube 50 through coupling capacitor 53. The control grid of oscillator tube 50 may be grounded through grid leak resistor 54.

The oscillator circuit is a tuned-plate oscillator which functions in a conventional manner. The frequency of the wave developed in tank circuit 21 may be adjusted or modulated in accordance with the signal impressed on terminals 32. If this signal is an automatic frequency control voltage, coupling capacitor 33 should be omitted. Thus, the circuit of Figure 4 may be used either in the manner of an automatic frequency control circuit or as a frequency modulator. The output wave may be obtained from inductor 55 inductively coupled to inductor 22.

There has thus been disclosed a variable reactance transistor circuit which may be used for adjusting, varying or modulating the frequency of a tuned circuit. Such an arrangement may be utilized for adjusting or modulating the frequency or the width of the pass band of an amplifier. Alternatively, the frequency of the wave developed by an oscillator circuit may be adjusted or modulated. The reactance of the variable reactance circuit is a function of the emitter and collector bias voltages. Preferably, however, the emitter bias voltage is adjusted or varied to vary the effective reactance of a circuit.

What I claim is:

1. A variable reactance circuit comprising a semi-conductor device including a semi-conducting body, a base electrode, an emitter electrode and a collector electrode in contact with said body, means for applying a bias voltage in the forward direction between said emitter and base electrodes and for applying a bias voltage in the reverse direction between said collector and base electrodes, a controlled resonant circuit coupled between said collector and base electrodes, an impedance element connected directly between said emitter and base electrodes and presenting a low impedance to currents at the frequency of said resonant circuit to provide an electrical low-impedance path for said currents between said emitter and base electrodes, and means for varying one of said bias voltages, thereby to vary the reactive impedance presented by said device and appearing between said collector and base electrodes.

2. A variable reactance circuit comprising a semi-conductor device including a semi-conducting body, a base electrode, an emitter electrode and a collector electrode in contact with said body, means for applying a bias voltage in the forward direction between said emitter and base electrodes and for applying a bias voltage in the reverse direction between said collector and base electrodes, a resonant circuit coupled between said collector and base electrodes, a capacitor connected between said emitter and base electrodes and presenting a low impedance to currents at the frequency of said resonant circuit, and means for varying one of said bias voltages, thereby to vary the reactive impedance presented by said device and coupled to said resonant circuit.

3. A variable reactance circuit comprising a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a resonant circuit coupled between said collector electrode and a point of substantially fixed potential, a capacitor connected between said emitter and base electrodes and providing a low impedance path between said emitter and base electrodes for currents at the frequency of said resonant circuit, and means for varying one of said voltages, thereby to vary the resonant frequency of said resonant circuit.

4. A variable reactance circuit comprising a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a resonant circuit coupled between said collector electrode and a point of substantially fixed potential, a capacitor connected between said emitter and base electrodes and providing a low impedance path between said emitter and base electrodes for currents at the frequency of said resonant circuit, and a source of signal for varying the voltage applied between said emitter and base electrodes, thereby to vary the resonant frequency of said resonant circuit.

5. A variable reactance circuit comprising a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a resonant circuit including a first capacitor, a second capacitor coupling said resonant circuit between said collector electrode and a point of substantially fixed potential, the reactive impedance of said third capacitor at the frequency of said resonant circuit being small compared to the resistance which appears looking into said emitter electrode, a third capacitor connected between said emitter and base electrodes, the capacitance of said second capacitor being large compared to that of said first capacitor, and a source of signal for varying the voltage applied between said emitter and base electrodes, thereby to vary the resonant frequency of said resonant circuit.

6. A variable reactance circuit comprising a semi-conductor including a semi-conducting body, a base electrode, an emitter electrode and a collector electrode in contact with said body, means connecting said base electrode to a point of substantially fixed potential, means for applying a voltage in the forward direction between said emitter and base electrodes, a source of voltage and a resistor connected in series between said collector and base electrodes for applying a voltage in the reverse direction between said collector and base electrodes the resistance of said resistor being large compared to the resistance which appears looking into said collector electrode, a resonant circuit including a first capacitor, a second capacitor coupling said resonant circuit between said collector electrode and a point of substantially fixed potential, the capacitance of said second capacitor being large compared to that of said first capacitor, a third capacitor connected between said emitter and base electrodes, the reactive impedance of said third capacitor at the frequency of said resonant circuit being small compared to the resistance which appears looking into said emitter electrode, and a source of signal for varying the voltage applied between said emitter and base electrodes, thereby to vary the resonant frequency of said resonant circuit.

7. A variable reactance circuit comprising an amplifier stage having input and output terminals, a resonant circuit coupled to said output terminals, a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a first capacitor coupling said resonant circuit to said collector electrode, a second capacitor connected between said emitter and base electrodes and providing a low impedance path between said emitter and base electrodes for currents at the frequency of said resonant circuit, and a source of signal for varying the voltage applied between said emitter and base electrodes, thereby to vary the resonant frequency of said resonant circuit.

8. A variable reactance circuit comprising an amplifier stage having input and output terminals, a parallel resonant circuit coupled to said output terminals and including a first capacitor, a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a second capacitor coupling said resonant circuit to said collector electrode, the capacitance of said second capacitor being large compared to that of said first capacitor, a third capacitor connected between said emitter and base electrodes the reactive impedance of said third capacitor at the frequency of said resonant circuit being small compared to the resistance which appears looking into said emitter electrode, and a source of signal for varying the voltage applied between said emitter and base electrodes, thereby to vary the resonant frequency of said resonant circuit.

9. A circuit having a variable band width comprising an amplifier stage having input and output terminals, a first resonant circuit coupled to said output terminals, a second resonant circuit inductively coupled to said first resonant circuit, said resonant circuits being normally tuned to substantially the same frequency, a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a first capacitor coupling said first resonant circuit to said collector electrode, a second capacitor connected between said emitter and base electrodes and providing a low impedance path between said emitter and base electrodes for currents at the frequency of said first resonant circuit, a source of control signal for varying the voltage applied to said emitter and base electrodes, and means for deriving an output signal from said second resonant circuit, thereby to vary the resonant frequency of said first resonant circuit and the band width of said amplifier stage.

10. A variable reactance system comprising an oscillator circuit including a frequency-determining circuit, a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a first capacitor coupling said frequency determining circuit to said collector electrode, a second capacitor connected between said emitter and base electrodes and providing a low impedance path between said emitter and base electrodes for currents at the frequency of said frequency determining circuit, and a source of signal for varying the voltage applied between said emitter and base electrodes, thereby to vary the resonant frequency of said oscillator circuit.

11. A frequency modulation system comprising an oscillator circuit including a frequency-determining resonant circuit having a first capacitor, a semi-conductor device including a semi-conducting body, a base electrode, an emitter electrode and a collector electrode in contact with said body, means connecting said base electrode to a point of substantially fixed potential, means including a source of voltage for applying a voltage in the forward direction between said emitter and base electrodes and for applying a voltage in the reverse direction between said collector and base electrodes, a second capacitor coupling said resonant circuit to said collector electrode, the capacitance of said second capacitor being large compared to that of said first capacitor, a third capacitor connected between said emitter and base electrodes, the reactive impedance of said third capacitor at the frequency of said resonant circuit being small compared to the resistance which appears looking into said emitter electrode, and a source of modulation signal for varying the voltage applied to said emitter and base electrodes, thereby to modulate the resonant frequency of said oscillator circuit.

12. A frequency modulation system comprising an oscillator circuit including a frequency determining resonant circuit having a first capacitor, a semi-conductor device including a semi-conducting body, a base electrode, an emitter electrode and a collector electrode in contact with said body, means connecting said base electrode to a point of substantially fixed potential, means for applying a voltage in the forward direction between said emitter and base electrodes, a source of voltage and a resistor connected in series between said collector and base electrodes for applying a voltage in the reverse direction between said collector and base electrodes, the resistance of said resistor being large compared to the resistance which appears looking into said collector electrode, a second capacitor coupling said resonant circuit to said collector electrode, a third capacitor connected between said emitter and base electrodes and providing a low impedance path between said emitter and base electrodes for currents at the frequency of said resonant circuit, and a source of modulation signal for varying the voltage applied to said emitter and base electrodes, thereby to modulate the resonant frequency of said oscillator circuit.

13. A frequency modulation system comprising an oscillator circuit including a frequency-determining resonant circuit having a first capacitor, a semi-conductor device including a semi-conducting body, a base electrode, an emitter electrode and a collector electrode in contact with said body, means connecting said beam electrode to a point of substantially fixed potential, means for applying a voltage in the forward direction between said emitter and base electrodes, a source of voltage and a resistor connected in series between said collector and base electrodes for applying a voltage in the reverse direction between said collector and base electrodes, the resistance of said resistor being large compared to the resistance which appears looking into said collector electrode, a second capacitor for coupling said resonant circuit to said collector electrode, the capacitance of said second capacitor being large compared to that of said first capacitor, a third capacitor connected between said emitter and base electrodes, the reactive impedance of said third capacitor at the frequency of said resonant circuit being small compared to the resistance which appears looking into said emitter electrode, and a source of modulation signal for varying the voltage applied to said emitter and base electrodes, thereby to modulate the resonant frequency of said oscillator circuit.

HUNTER C. GOODRICH, JR.

REFERENCES CITED

The following references are of record in the file of this patent:

UNITED STATES PATENTS

| Number | Name | Date |
|---|---|---|
| 2,486,776 | Barney | Nov. 1, 1949 |
| 2,533,001 | Eberhard | Dec. 5, 1950 |